(12) United States Patent
Terazaki et al.

(10) Patent No.: US 8,133,338 B2
(45) Date of Patent: Mar. 13, 2012

(54) STACK STRUCTURE AND METHOD OF MANUFACTURING THE SAME

(75) Inventors: Tsutomu Terazaki, Fussa (JP); Osamu Nakamura, Kodaira (JP); Keishi Takeyama, Hamura (JP); Masatoshi Nomura, Fussa (JP)

(73) Assignee: Casio Computer Co., Ltd., Tokyo (JP)

( * ) Notice: Subject to any disclaimer, the term of this patent is extended or adjusted under 35 U.S.C. 154(b) by 1036 days.

(21) Appl. No.: 12/031,517

(22) Filed: Feb. 14, 2008

(65) Prior Publication Data

US 2008/0145970 A1 Jun. 19, 2008

Related U.S. Application Data

(62) Division of application No. 11/080,272, filed on Mar. 14, 2005, now abandoned.

(30) Foreign Application Priority Data

Mar. 23, 2004 (JP) ................................. 2004-084846
Mar. 23, 2004 (JP) ................................. 2004-084907
Mar. 23, 2004 (JP) ................................. 2004-084939

(51) Int. Cl.
*B32B 33/00* (2006.01)
*B32B 37/26* (2006.01)
*C03B 23/20* (2006.01)
*C03C 27/04* (2006.01)

(52) U.S. Cl. ..................... 156/90; 156/272.2; 156/273.1; 156/273.9; 65/36; 65/42; 65/43; 65/59.1; 65/59.3; 65/59.34; 65/59.4

(58) Field of Classification Search ............... 156/272.2, 156/90, 273.1, 273.9; 65/36, 42, 43, 59.1, 65/59.3, 59.34, 59.4
See application file for complete search history.

(56) References Cited

U.S. PATENT DOCUMENTS

| | | | |
|---|---|---|---|
| 3,397,278 A | 8/1968 | Pomerantz | |
| 5,467,112 A | 11/1995 | Mitani | |
| 5,534,328 A * | 7/1996 | Ashmead et al. | 428/166 |
| 5,769,997 A | 6/1998 | Akaike et al. | |
| 6,109,113 A * | 8/2000 | Chavan et al. | 73/718 |
| 6,147,478 A | 11/2000 | Skelton et al. | |
| 6,475,326 B2 * | 11/2002 | Gross | 156/272.2 |
| 6,749,814 B1 | 6/2004 | Bergh et al. | |
| 6,972,154 B2 | 12/2005 | Gross | |
| 7,205,625 B2 | 4/2007 | Nakamura et al. | |

(Continued)

FOREIGN PATENT DOCUMENTS

DE 41 36 075 A1 5/1993

(Continued)

OTHER PUBLICATIONS

English language machine translation of Japanese patent application publication 2003-206351.*

(Continued)

*Primary Examiner* — Jason L. Lazorcik
(74) *Attorney, Agent, or Firm* — Holtz, Holtz, Goodman & Chick, PC

(57) ABSTRACT

A stack structure is formed by stacking and bonding a plurality of substrates. The stack structure includes bonding films each of which is interposed in a bonding region between, adjacent glass substrates, and bonded to oxygen atoms in the glass of the substrate by anodic bonding.

11 Claims, 10 Drawing Sheets

U.S. PATENT DOCUMENTS

| | | | |
|---|---|---|---|
| 7,255,768 B2 * | 8/2007 | Ko et al. | 156/272.2 |
| 7,854,776 B2 * | 12/2010 | Terazaki | 48/127.9 |
| 2002/0069960 A1 | 6/2002 | Gross | |
| 2003/0190508 A1 * | 10/2003 | Takeyama et al. | 429/20 |
| 2004/0148858 A1 | 8/2004 | Yamamoto et al. | |
| 2008/0145970 A1 * | 6/2008 | Terazaki et al. | 438/109 |

FOREIGN PATENT DOCUMENTS

| | | |
|---|---|---|
| JP | 2001-158645 A | 6/2001 |
| JP | 2001-158672 A | 6/2001 |
| JP | 2001-228159 A | 8/2001 |
| JP | 2003-306351 A | 10/2003 |
| WO | WO 03/082460 A1 | 10/2003 |

OTHER PUBLICATIONS

A. Berthold et al: "Glass-To-Glass Anodic Bonding With Standard IC Technology Thin Films As Intermediate Layers", Sensors and Actuators A, Elsevier Sequoia S.A., Lausanne, Switzerland; vol. 82, No. 1-3, May 2000 (May 2000). ISSN: 0924-4247, Figures 1,4, paragraphs '0002!, '0003!.

A. Berthold et al, "Glass-to-Glass anodic bonding with standard IC technology thin films as intermediate layers", 2000 Elsevier Science S.A., Sensors and Actuators 82 (2000) pp. 224-228.

Japanese Office Action dated Feb. 17, 2009 (2 pages), and English translation thereof (4 pages) issued in counterpart Japanese Application No. 2004-084939.

\* cited by examiner

STACK STRUCTURE AND METHOD OF MANUFACTURING THE SAME

CROSS-REFERENCE TO RELATED APPLICATIONS

The present application is a Divisional Application of U.S. application Ser. No. 11/080,272 filed Mar. 14, 2005, now abandoned which is based upon and claims the benefit of priority from prior Japanese Patent Applications No. 2004-084846, filed Mar. 23, 2004; No. 2004-084907, filed Mar. 23, 2004; and No. 2004-084939, filed Mar. 23, 2004, the entire contents of all of which are incorporated herein by reference.

BACKGROUND OF THE INVENTION

1. Field of the Invention

The present invention relates to a stack structure formed by stacking a plurality of including at least one substrate substrates and a method of manufacturing the same.

2. Description of the Related Art

In recent years, small reactors called "microreactors" have been developed and put into practical use. Microreactors are small reactors which cause a plurality of kinds of reactants such as raw materials, reagents, and fuels to react with each other while mixing them. The microreactors are used for chemical reaction experiments in the microdomain, drug developments, artificial organ developments, genome/DNA analysis tools, and fundamental analysis tools for micro-fluid engineering. A chemical reaction using a microreactor has characteristic features different from those of a normal chemical reaction using a beaker or flask. For example, since the entire reactor is small, the heat exchange effectiveness is very high, and temperature control can efficiently be executed. For this reason, even a reaction which needs fine temperature control or a reaction which requires abrupt heating or cooling can easily be done.

More specifically, a microreactor has one or more channels (flow paths) which make reactants to flow and a reactor (reaction tank) in which the reactants react with each other. In Jpn. Pat. Appln. KOKAI Publication No. 2001-228159, a silicon substrate in which a trench is formed in a predetermined pattern and a PYREX (registered trademark) substrate made of glass are stacked and anodic-bonded, thereby forming a channel in the closed region between the two substrates. The term "anodic bonding" indicates a bonding technique. In this technique, a positive electrode is arranged on the silicon substrate while a negative electrode is arranged on the glass substrate in a hot environment. A high voltage is applied between both electrodes to generate an electric field in the glass substrate. Oxygen atoms in the glass substrate, which have negative charges, are moved to the silicon substrate side so that the oxygen atoms in the glass substrate are interatomic-bond to silicon atoms in the silicon substrate at the interface between the glass substrate and the silicon substrate. This technique is known as excellent especially in substrate bonding because substrates can be bonded without using any adhesive, or substrates can be bonded in air.

An attempt has been made to alternately stack a plurality of glass substrates and a plurality of silicon substrates and anodic-bond them to create a microreactor having a stack structure. In this case, it is difficult to bond silicon substrates to both surfaces of a glass substrate. Hence, a stack structure can hardly be manufactured. As shown in FIG. 12A, in the first anodic bonding step, a silicon substrate 301 and glass substrate 302 are arranged while making one surface 302a of the glass substrate 302 contact one surface 301a of the silicon substrate 301. A voltage is applied between them to generate an electric field in the direction of solid arrows and cause bonding at the interface between the surfaces 301a and 302a. Subsequently, in the second anodic bonding step, as shown in FIG. 12B, a new silicon substrate 303 and the glass substrate 302 are arranged while making one surface 303a of the silicon substrate 303 contact the other surface 302b of the glass substrate 302. A voltage is applied between the silicon substrates to generate an electric field in the direction of solid arrows. The direction of this electric field is reverse to the direction (broken arrows in FIG. 12B) of the electric field in the first anodic bonding step. This adversely affects the bonding between the silicon substrate 303 and the other surface of the glass substrate 302 which is anodic-bonded to the silicon substrate 301 in the first anodic bonding step.

BRIEF SUMMARY OF THE INVENTION

The present invention advantageously makes it possible to easily manufacture a stack structure from at least three substrates.

A stack structure according to a first aspect of the present invention is a stack structure formed by stacking and bonding a plurality of substrates, comprising:

a bonding film which is interposed in a bonding region between, of the plurality of substrates, a first substrate and a second substrate containing glass, and bonded to oxygen atoms in the glass of the second substrate by anodic bonding.

According to the stack structure of this aspect, the bonding film bonded to the oxygen atoms in the glass of the second substrate by anodic bonding can satisfactorily be bonded between the first substrate and the second substrate. When the bonding film is provided on a predetermined surface of the substrate, the electric field in anodic bonding between the surface and the substrate containing glass can be set in a predetermined direction.

A stack structure according to a second aspect of the present invention is a stack structure formed by stacking and bonding a plurality of substrates including at least a glass substrate, comprising:

a buffer film which is interposed in a bonding region of the glass substrate of the plurality of substrates and receives an alkali component in the glass substrate, which has moved due to a voltage applied to the glass substrate.

A stack structure manufacturing method according to a third aspect of the present invention is a method of manufacturing stack structure including a plurality of substrates, comprising:

executing anodic bonding to bond a bonding film which is interposed between, of the plurality of substrates, a first substrate and a second substrate containing glass to oxygen atoms in the glass of the second substrate.

According to this manufacturing method, the bonding film bonded to the oxygen atoms in the glass of the second substrate by anodic bonding can satisfactorily be bonded between the first substrate and the second substrate. When the bonding film is provided on a predetermined surface of the substrate, the electric field in anodic bonding between the surface and the substrate containing glass can be set in a predetermined direction.

A stack structure manufacturing method according to a fourth aspect of the present invention is a method of manufacturing a stack structure including a plurality of substrates, comprising steps of:

bringing one surface of a glass substrate of the plurality of substrates into contact with another substrate; and anodic-bonding the glass substrate to the ether substrate in a state in which a buffer film capable of receiving an alkali component in the glass substrate is provided on the other surface of the glass substrate.

In the manufacturing method according to the fourth aspect, even when the alkali components in the glass substrate move to the other surface side of the glass substrate due to the electric field in anodic bonding, the buffer film receives the alkali components. Hence, deposition of the alkali components on the other surface side of the glass substrate can be suppressed.

DETAILED DESCRIPTION OF THE INVENTION

The best mode for carrying out the present invention will be described below with reference to the accompanying drawings. Various kinds of limitations which are technically preferable in carrying out the present invention are added to the embodiments to be described below. However, the spirit and scope of the present invention are not limited to the following embodiments and illustrated examples.

First Embodiment

A method of manufacturing a first stack microreactor to which the present invention is applied will be described with reference to FIGS. 1A to 4.

Figure 1A:
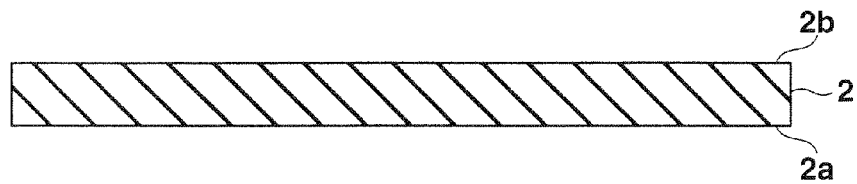
FIGS. 1A to 1D are sectional views showing steps in manufacturing a stack microreactor according to an embodiment of the present invention.

As shown in FIG. 1A, an ionic conductive glass substrate 2 is prepared, which contains an alkali metal such as sodium, lithium, or potassium by doping an alkali compound such as an alkali oxide (e.g., sodium oxide ($Na_2O$), lithium oxide ($Li_2O$), or potassium oxide ($K_2O$)) or alkali carbonate (e.g., lithium carbonate ($Li_2CO_3$)). Especially, glass containing Li is preferably used because Li ions have a small radius and therefore readily move in the glass in an electric field. For example, PYREX (registered trademark) glass containing Na atoms or a glass substrate containing Li atoms (SW-YY available from ASAHI TECHNOGLASS CORPORATION) can be used as the glass substrate 2.

Figure 1B:
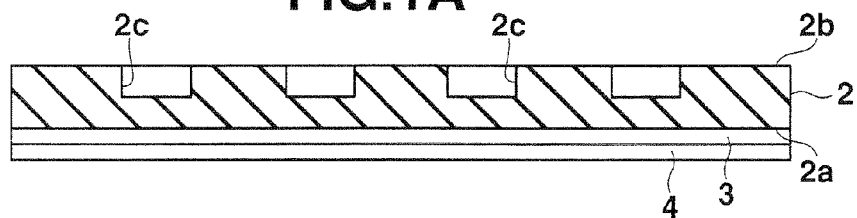

As shown in FIG. 1B, a conductive buffer film 3 which has a moderate alkali ionic permeability and a resistivity lower than that of the glass substrate 2 and higher than that of a metal alone is formed on an entire surface 2a of the glass substrate 2. A bonding film 4 including a single-layered film made of a metal or an alloy containing the metal, or a multilayered film thereof is formed on the buffer film 3. A zigzag trench 2c is formed in the other surface 2b of the glass substrate 2. When the other surface 2b is bonded to another glass substrate 2 (FIG. 1D) to be described later, through the bonding film 4, the trench 2c forms a space (flow path) where a chemical reaction occurs in a microreactor having a closed upper surface. The width and depth of the flow path are, e.g., 500 µm or less.

The bonding film 4 is oxidized by oxygen atoms in the other glass substrate 2 (FIG. 1D) to be described below and causes covalent bond to the other glass substrate 2 so that the bonding film 4 is anodic-bonded to the other glass substrate 2. Preferably, the bonding film 4 exhibits a conductivity before oxidation to easily make a current flow by anodic bonding, a low oxidation progress speed at room temperature and atmospheric pressure, and a moderate oxidation progress speed under anodizing conditions. As a detailed material of the bonding film 4 before oxidation, a metal or alloy having a melting point of 2,000° C. or more is preferably used. More specifically, the bonding film 4 preferably contains at least one of Ta (melting point: 2,990° C.), W (melting point: 3,400° C.), Mo (melting point: 2,620° C.), $TaSi_2$ (melting point: 2,200° C.), $WSi_2$ (melting point: 2,170° C.), and $MoSi_2$ (melting point: 2,050° C.). A metal having a melting point lower than 2,000° C. tends to be easily oxidized in air, and anodic bonding must be executed in a vacuum atmosphere. This makes the management and manufacturing process complicated and increases the cost.

The buffer film 3 relaxes deposition of alkali ions in the glass substrate 2, which are deposited as a deposit on the surface of the glass substrate 2 by anodic bonding. The buffer film 3 is preferably made of a conductive substance which has a resistivity lower than that of the glass substrate 2 and, more particularly, a resistivity of about 0 to 10 kΩ·cm and an alkali ionic permeability to contain alkali ions in the glass substrate 2 to some extent at the time of anodic bonding. An oxide can be used as the buffer film 3. Especially, an amorphous (non-crystalline oxide is more preferable than a polycrystal. The reasons for this are as follows. The interatomic distance in an amorphous oxide is longer than that in a polycrystalline oxide. The alkali ions more readily pass through the amorphous oxide than the polycrystalline oxide. Since the grain boundary of a polycrystalline film has a high resistance, and the field distribution readily becomes nonuniform, an in-plane variation occurs in the bonding reaction.

More specifically, a compound containing Ta, Si, and O as component elements (to be referred to as a "Ta—Si—O based material" hereinafter), a compound containing La, Sr, Mn, and O as component elements at a composition ratio of La:Sr:Mn:O=0.7:0.3:1:(3-x) (to be referred to as $La_{0.7}Sr_{0.3}MnO_{3-x}$ hereinafter), or lead glass can be used as the buffer film 3. In this case, $0 \leq x < 1$. Both the Ta—Si—O based material and $La_{0.7}Sr_{0.3}MnO_{3-x}$ are amorphous oxides.

To form the buffer film 3 of the Ta—Si—O based material, the glass substrate 2 is set in a sputtering apparatus as a coating target. Sputtering is executed by using, as a target, a plate which is made of Ta and contains Si in an atmosphere containing Ar gas and $O_2$ gas. In the sputtering step, when ions collide against the target, secondary ions are emitted from the target. The emitted secondary ions collide against the glass substrate 2 so that the buffer film 3 of the Ta—Si—O based material is formed on the lower surface of the glass substrate 2. Especially when the bonding film 4 is made of Ta, the buffer film 3 of the Ta—Si—O based material has an excellent bonding effect between them.

To form the buffer film 3 of $La_{0.7}Sr_{0.3}MnO_{3-x}$, first, each of lanthanum nitrate (La $(NO_3)_3.6H_2O$), strontium nitrate (Sr $(NO_3)_3$), and manganese nitrate ($Mn(NO_3)_3.6H_2O$) is dissolved separately in 1-methyl-2-pyrrolidone. The lanthanum nitrate solution, strontium nitrate solution, and manganese nitrate solution are then mixed. The prepared solution is applied to the surface of the glass substrate 2. The glass substrate 2 whose surface with the applied solution faces up is set in a vacuum desiccator. When a vacuum pressure is set in the vacuum desiccator by using a vacuum pump, the applied solution evaporates, and the viscosity increases. Next, the glass substrate 2 is unloaded from the vacuum desiccator and sets in an electric furnace. When a vacuum pressure is set in the electric furnace, and the glass substrate 2 is heated therein, the buffer film 3 of $La_{0.7}Sr_{0.3}MnO_{3-x}$ is formed.

A plurality of samples each having the buffer film 3 and bonding film 4 sequentially formed on the surface 2a of the glass substrate 2 are prepared in the above-described way.

Figure 1C:
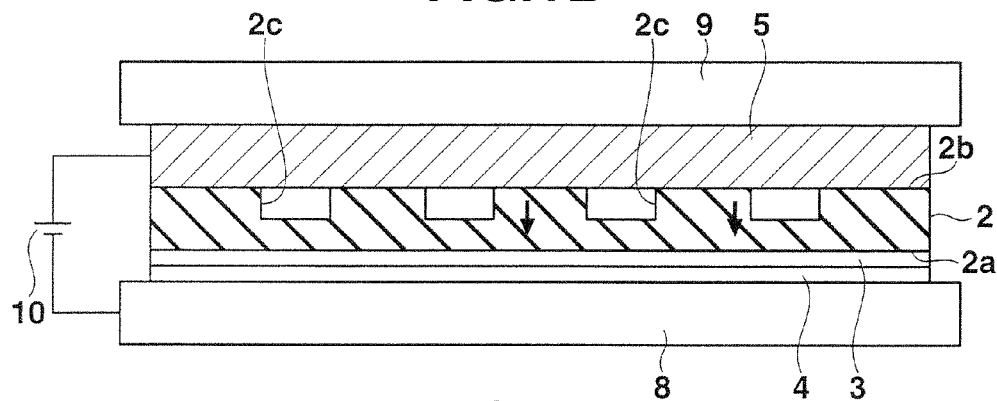

As shown in FIG. 1C, a conductive silicon substrate 5 is anodic-bonded to the other surface 2b of the glass substrate 2. At this time, the negative pole of an anodic bonding apparatus 10 is connected to the bonding film 4 through a conductive stage 8. The positive pole of the anodic bonding apparatus 10 is connected to the silicon substrate 5. A voltage is applied such that the potential of the silicon substrate 5 becomes higher than that of the bonding film 4. Since the bonding film 4 is formed on the buffer film 3, the silicon substrate 5 has a higher potential than the buffer film 3. The stage 8 serves as a resistive heating element by itself or separately includes a heating element to heat the glass substrate 2 to a predetermined temperature. The silicon substrate 5 is pressed against the glass substrate 2 by using a weight plate 9 which applies a load uniformly in the in-plane direction. Then, a voltage is applied by the anodic bonding apparatus 10 and the glass substrate 2 is heated to a predetermined temperature such as 300° C. to 400° C. by the heat-producing stage 8, thereby executing anodic bonding. Alkali ions in the glass substrate 2 are attracted to the buffer film 3 near the negative electrode. Electrons in the glass substrate 2 concentrate to the surface 2b which is in contact with the silicon substrate 5. Firm interatomic bond (covalent bond) occurs between the glass substrate 2 and the silicon substrate 5 so that both substrates 2, 5 are anodic-bonded. The silicon substrate 5 to be used can be either a silicon amorphous silicon or a substrate made of crystalline silicon such as single-crystal silicon or polysilicon.

Since the buffer film 3 capable of receiving alkali ions is formed on one surface 2a of the glass substrate 2, the alkali ions in the glass substrate 2 are moderately dispersed into the buffer film 3 through which the alkali ions pass at the time of anodic bonding. Since the alkali ions are not localized at (entirely distributed over) the interface between the glass substrate 2 and the buffer film 3 or the interface between the buffer film 3 and the bonding film 4, any bonding failure at these interfaces is suppressed. In addition, since a solid body such as an oxide composed of alkali ions is rarely deposited on the surface of the bonding film 4, any adverse influence on the bonding effect on the surface can be prevented.

Figure 2:
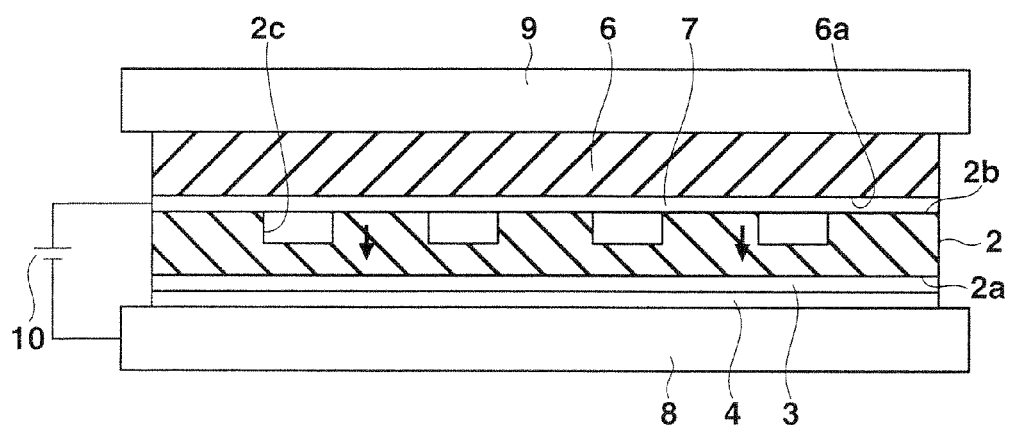
FIG. 2 is a sectional view for explaining a step executed instead of FIG. 1C.

As shown in FIG. 2, a glass substrate 6 having, on one surface 6a, a bonding film 7 formed from a metal film, alloy film, or a multilayered film thereof may be used in place of the silicon substrate 5, and the surface 6a may be anodic-bonded to the glass substrate 2 at 300° C. to 400° C. In this case, the bonding film 7 is selected from the above-described materials of the bonding film 4. The bonding films 4, 7 can use either the same material composition or different material compositions. The negative pole of the anodic bonding apparatus 10 electrically is connected to the bonding film 4 of the glass substrate 2 through the stage 8 (that is, a negative electrode (not shown) is attached to the stage 8). The positive pole of the anodic bonding apparatus 10 is electrically connected to the bonding film 7 of the glass substrate 6. A voltage is then applied such that the potential of the bonding film 7 becomes higher than that of the bonding film 4. The solid arrows in FIG. 2 indicate the direction of the electric field by anodic bonding. When the substrate 6 made of glass is used, a film like the buffer film 3 may be interposed between the glass substrate 6 and the bonding film 7.

Figure 1D:
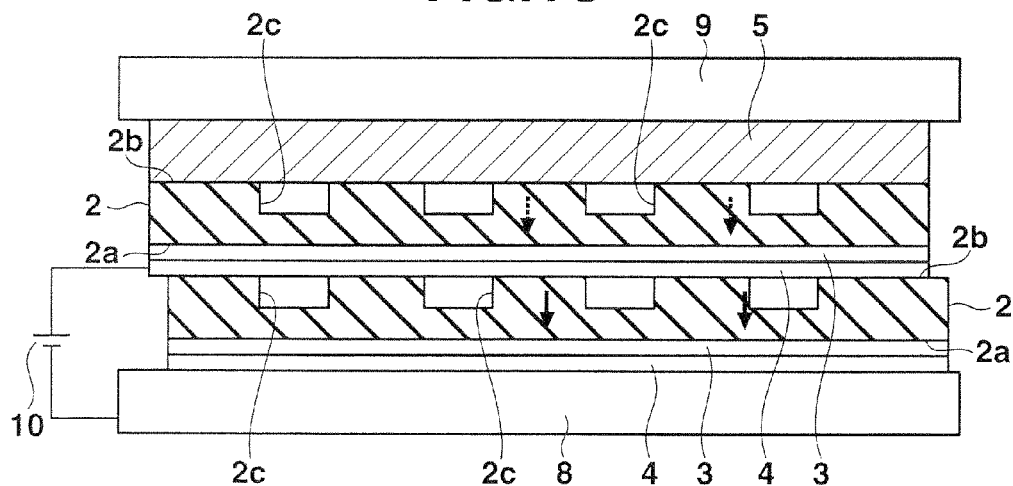

After the silicon substrate 5 or the bonding film 7 of the glass substrate 6 is anodic-bonded to the first glass substrate 2, as shown in FIG. 1D, the other or second glass substrate 2 which has the buffer film 3 and bonding film 4 formed on one surface 2a is placed on the precedingly bonded glass substrate 2 such that the other surface 2b of the second glass substrate 2 comes into contact with the bonding film 4 of the first glass substrate 2. Then, the both substrates 2 are anodic-bonded at 300° C. to 400° C. The second glass substrate 2 is arranged such that the surface of the bonding film 4 of the first glass substrate 2 is partially exposed. The positive electrode of the anodic bonding apparatus 10 is connected to the exposed surface of the bonding film 4 of the first glass substrate 2. The negative electrode of the anodic bonding apparatus 10 is connected to the bonding film 4 of the second glass substrate 2 through the conductive stage 8. A voltage is then applied such that the potential of the new bonding film 4 becomes higher than that of the preceding bonding film 4. The broken arrows in FIG. 1D indicate the direction of the electric field by the first anodic bonding (anodic bonding in FIG. 1C). The solid arrows indicate the direction of the electric field by the new anodic bonding. At the newly anodic-bonded interface, atoms contained in the bonding film 4 of the first glass substrate 2 are firmly bonded to oxygen atoms in the second glass substrate 2.

In this case, the subsequent anodic bonding can be executed in the same electric field direction as that of the preceding anodic bonding shown in FIG. 1C. For this reason, the bonding effect in the precedingly anodic-bonded portion is not degraded by the electric field in the subsequent anodic bonding.

When the other surface 2b of the second glass substrate 2 is to be anodic-bonded to the bonding film 4 of the first glass substrate 2, the bonding film 4 need not always be formed on the second substrate 2. In this case, the negative electrode of the anodic bonding apparatus 10 is connected to the buffer film 3 of the second glass substrate 2 through the stage 8. The positive electrode of the anodic bonding apparatus 10 is connected to the exposed bonding film 4 of the first glass substrate 2. After anodic bonding, the bonding film 4 is formed on the buffer film 3 of the new glass substrate 2.

Figure 3:
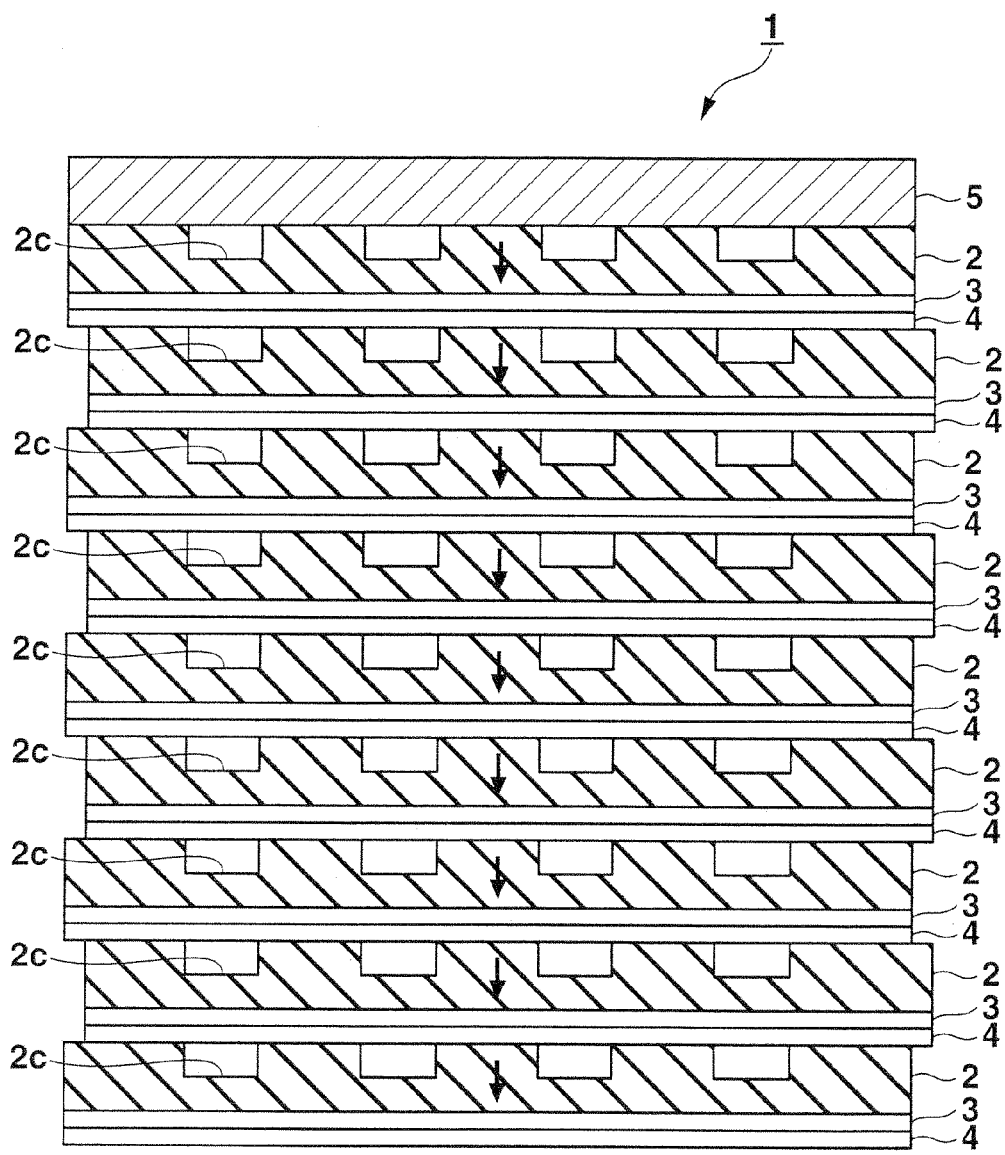
FIG. 3 is a sectional view showing a completed stack microreactor.

After that, the step shown in FIG. 1D is repeated to sequentially stack and anodic-bond the plurality of glass substrates 2 each having the buffer film 3 and bonding film 4, as shown in FIG. 3. Anodic bonding is executed sequentially from the upper glass substrate 2 to the lower glass substrate 2 in FIG. 3. In this way, a stack microreactor 1 serving as a chemical reaction furnace is completed by stacking the glass substrates 2. Referring to FIG. 3, of the two adjacent glass substrates 2, the upper glass substrate 2 has the buffer film 3 and bonding film 4 sequentially formed on the surface on the side of the lower glass substrate 2. The lower glass substrate 2 is anodic-bonded to the bonding film 4 of the upper glass substrate 2.

As another example of anodic bonding, the buffer film 3 is arranged on the stage 8. Neither buffer film 3 nor bonding film 4 is formed on the surface 2a of the glass substrate 2 whose other surface 2b should be anodic-bonded to the silicon substrate 5 or glass substrate 6. The glass substrate 2 having the silicon substrate 5 or glass substrate 6 thereon it is located on the stage 8 such that the surface 2a comes into contact with the buffer film 3. The negative pole of the anodic bonding apparatus 10 is electrically connected to the buffer film 3 through the stage 8. The positive pole of the anodic bonding apparatus 10 is electrically connected to the silicon substrate 5 or the bonding film 7 of the glass substrate 6. Anodic bonding may be executed in this state. At this time, the deposit by alkali ions is rarely produced on the stage 8 by the buffer film 3. After the bonding film 4 is formed on the surface 2a of the preceding or first glass substrate 2, which is almost free from the deposit, the new or second glass substrate 2 is anodic-bonded to the surface 2a of the first glass substrate 2.

Referring to FIG. 3, each glass substrate 2 is anodic-bonded to the lower bonding film 4 by applying a voltage to make the potential of the upper bonding film 4 (the silicon substrate 5 for the uppermost glass substrate 2) higher than that of the lower bonding film 4. Hence, in anodic bonding, an electric field directed downward is applied to all glass substrates 2, as indicated by the solid arrows. The arrows shown in FIG. 3 indicate the direction of the electric field which acts in anodic bonding of each glass substrate 2.

Figure 4A:
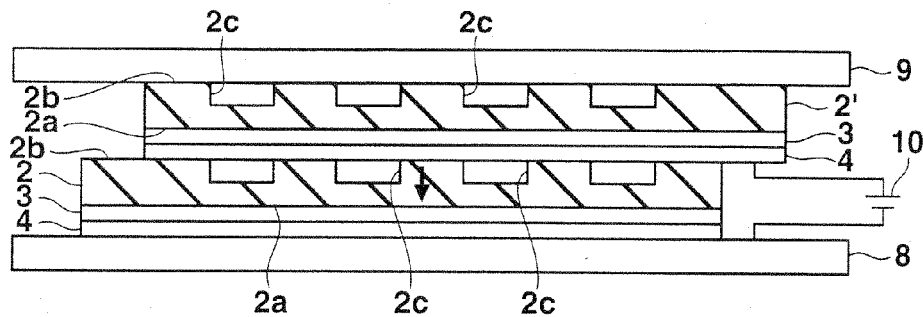
FIGS. 4A to 4C are sectional views for illustrating steps in manufacturing a stack microreactor according to another embodiment of the present invention.
Figure 4B:
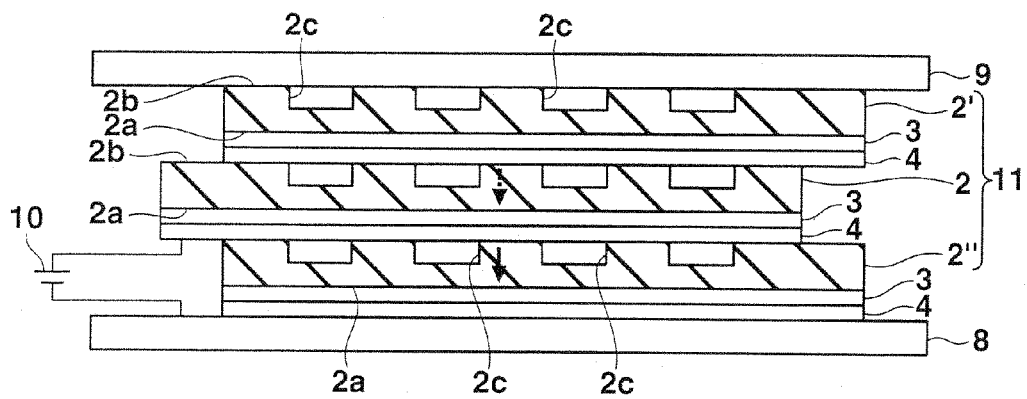
Figure 4C:
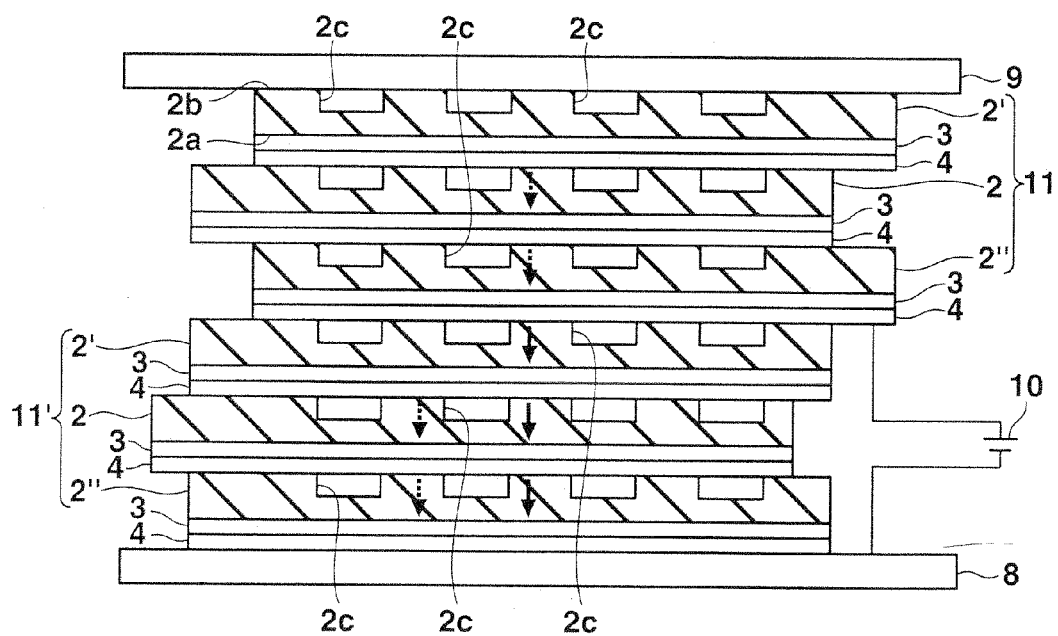

In the example shown in FIG. 3, the glass substrates 2 are anodic-bonded one by one, Instead, as shown in FIGS. 4A to 4C, the plurality of anodic-bonded glass substrates 2 may be anodic-bonded. Referring to FIG. 4A, the first glass substrate 2 having the buffer film 3 and bonding film 4 sequentially formed on one surface 2a is placed on the conductive stage 8 such that the bonding film 4 comes into contact with the stage 8. A second glass substrate 2' having the buffer film 3 and bonding film 4 sequentially formed on one surface 2a is placed on the other surface of the first glass substrate 2 such that the bonding film 4 of the second glass substrate 2' comes into contact with the first glass substrate 2. A load is applied to the other surface 2b of the second glass substrate 2' by the weight 9. In this state, the positive pole of the anodic bonding apparatus 10 is electrically connected to the exposed surface of the bonding film 4 provided on the side of the surface 2a of the second glass substrate 2'. The negative pole of the anodic bonding apparatus 10 is electrically connected to the bonding film 4 provided on the first glass substrate 2 through the conductive stage 8. The first anodic bonding is executed such that an electric field is generated in the direction of solid arrow.

Subsequently, as shown in FIG. 4B, a third glass substrate 2" having the buffer film 3 and bonding film 4 provided on one surface 2a is placed between the stage 8 and the first glass substrate 2. At this time, the positive pole of the anodic bonding apparatus 10 is electrically connected to the exposed bonding film 4 of the first glass substrate 2. The negative pole is electrically connected to the bonding film 4 of the third glass substrate 2" through the stage 8. In this state, the second anodic bonding is executed. The direction of the electric field is the same as that (broken arrow) in the first anodic bonding. A first substrate group 11 of the glass substrates 2, 2', and 2" bonded in this way is formed.

After that, a second substrate group 11' formed by the first anodic bonding and second anodic bonding, like the first substrate group 11, is placed between the first substrate group 11 and the stage 8. The positive pole of the anodic bonding apparatus 10 is connected to the bonding film 4 provided on the second glass substrate 2" of the first substrate group 11. The negative pole of the anodic bonding apparatus 10 is connected to the bonding film 4 provided on the second glass substrate 2" of the second substrate group 11' through the conductive stage 8. In this state, the third anodic bonding is executed. The direction (solid arrows) of the electric field at this time is the same as those (broken arrows) in the first anodic bonding and second anodic bonding.

As described above, in this embodiment, the bonding film 4 which can be oxidized by oxygen atoms in the glass substrate 2 by anodic bonding is formed on the side of the surface 2a to be anodic-bonded. Hence, as shown in FIG. 1D, anodic bonding can be executed by using the bonding film 4 as the positive electrode and a portion of the new glass substrate 2 near the surface 2a as the negative electrode. At this time, since a voltage is applied between both surfaces of the new glass substrate 2, an electric field is generated in the new glass substrate 2. However, the electric field is rarely generated in the precedingly bonded glass substrate 2. Especially, in bonding the new glass substrate 2, no electric field is generated in the preceding glass substrate 2 in the direction reverse to the electric field in the preceding anodic bonding. When the bonding film 4 is formed on the surface opposite to the bonding surface of the glass precedingly bonded substrate 2, the new glass substrate 2 can be bonded to the precedingly bonded glass substrate 2. In addition, since the electric fields in the respective anodic bonding operations do not act in reverse directions in the glass substrates 2, no discoloring occurs in the glass substrates 2 due to reverse fields. For this reason, the stack structure can easily be manufactured.

In addition, as shown in FIGS. 4A to 4C, of the anodic-bonded glass substrates 2, the side to be newly anodic-bonded, i.e., the surface 2a has the bonding film 4 which can be oxidized by oxygen atoms in the glass substrate 2 by anodic bonding. When anodic bonding is executed a plurality of number of times, electric fields are directed in the same direction in the respective anodic bonding operations. Hence, neither bonding failure nor degradation in bonding effect occurs due to reverse fields.

Figure 5:
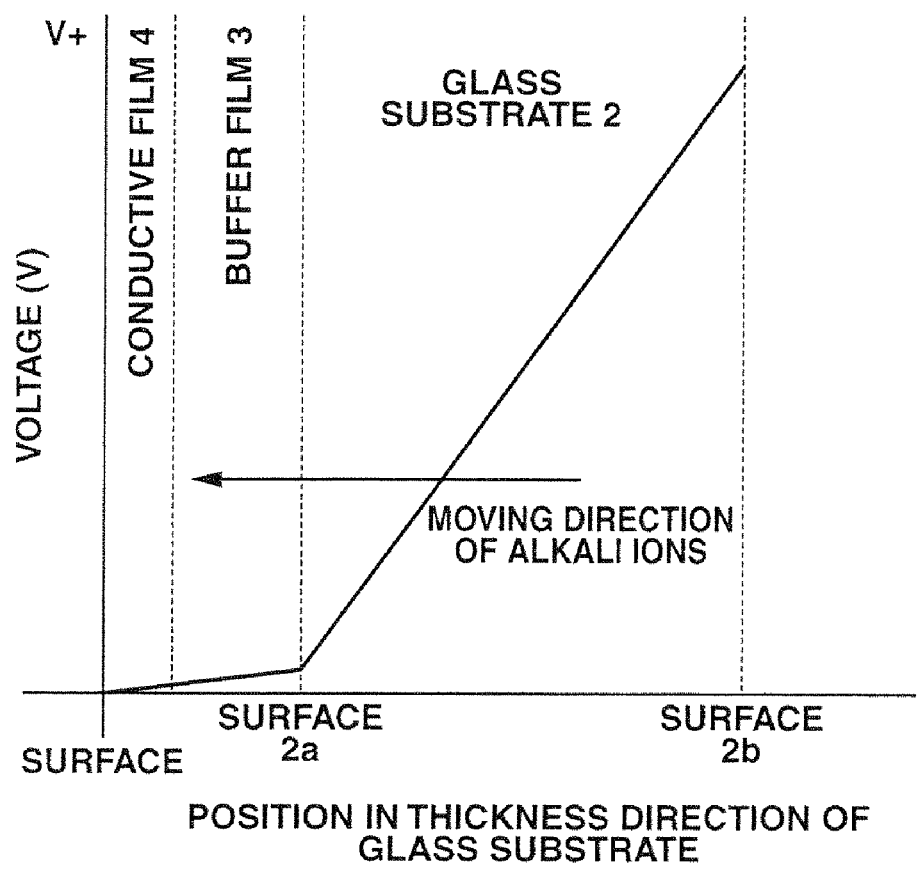
FIG. 5 is a graph showing the relationship between the voltage and the distance from the surface of a buffer film 3.

Of the anodic-bonded glass substrates 2, the side to be newly anodic-bonded, i.e., the surface 2a has the buffer film 3. Alkali ions in the glass substrate 2 are dispersed in the buffer film 3 in the preceding anodic bonding. Hence, any deposition on the interface between the buffer film 3 and the surface 2a to be newly anodic-bonded or the surface of the buffer film 3 can be suppressed. This can be explained as follows. As shown in FIG. 5, immediately after anodic bonding, alkali compositions and oxygen in the glass substrate 2 are ionized and serve as carriers so that a small current flows in the glass substrate 2. Hence, an electric field $E_a$ in the glass substrate 2 is higher than an electric field $E_b$ in the buffer film 3. At this time, each of the electric fields $E_a$ and $E_b$ is represented by a function of a distance d from the surface of the buffer film 3 and time t from the start of anodic bonding. Note that the bonding film 4 is made of a metal or alloy and therefore has a resistivity and sheet resistance much lower than those of the high-resistance glass substrate 2 or the buffer film 3 formed from a metal oxide film. Hence, the voltage division ratio is negligible. In anodic bonding, alkali ions are attracted and moved to the negative electrode side. Let q be the charges of alkali ions. A force F received by the alkali ions in the glass substrate 2 is given by $$F=q \cdot E_a$$

On the other hand, a force f received by the alkali ions in the buffer film 3 is given by $$f=q \cdot E_b$$

Hence, for the forces received by the alkali ions, the electric fields $E_a$ and $E_b$ are compared. When the time t is zero or sufficiently small, the electric fields $E_a$ and $E_b$ as shown in FIG. 5 are obtained. The electric fields $E_a$ and $E_b$ have almost predetermined values regardless of the positions in the glass substrate 2 and buffer film 3. Since the electric conductivity of the buffer film 3 is higher than that of the glass substrate 2, the electric field $E_b$ is smaller than the electric field $E_a$. In addition, the electric field $E_b$ is not zero, and the alkali ions receive a weak force in the direction of the surface of the buffer film 3. Hence, the alkali ions in the glass substrate 2 move to the buffer film 3 to some extent.

When the time t has sufficiently elapsed (anodic bonding enable time), the electric fields $E_a$ and $E_b$ have no predetermined values in the glass substrate 2 and buffer film 3. The graph shown in FIG. 5 changes from the straight line to a curve projecting upward. This occurs due to the screening effect of positive ions, qualitatively like electrons in the semiconductor layer near the oxide film of a metal oxide semiconductor (MOS) device or near the electrode in an electrolytic solution. If the buffer film 3 is not present, the alkali ions move until the charges near the negative electrode are canceled. Hence, the alkali ions are deposited on the surface of the glass substrate 2 in a form of, e.g., an alkali oxide. When the buffer film 3 is not present, an electric field $E_A$ in the glass substrate 2 is also represented by a function whose locus on the graph projects upward because of the screening effect. Qualitatively, electric field $E_b$<electric field $E_a$<electric field $E_A$. When the buffer film 3 is not present, the alkali ion concentration concentrates to the surface near the surface of the glass substrate 2 or the interface. However, when the buffer film 3 which can contain alkali ions to some extent and has a resistivity lower than the glass substrate 2 is present, the concentration of the alkali ions in the glass substrate 2 can be prevented from concentrating to the surface 2a by dispersing the field intensity by anodic bonding.

The concentration of the alkali ions in the glass substrate 2 can be prevented from concentrating to the interface between the buffer film 3 and the glass substrate 2. In addition, a compound formed by alkali ions can be prevented from being deposited on the surface of the bonding film 4. Even when the new glass substrate 2 is anodic-bonded to the bonding film 4 of the precedingly anodic-bonded glass substrate 2, the new glass substrate 2 does not peel from the bonding film 4 of the precedingly anodic-bonded glass substrate 2. For this reason, a stack structure having a high bonding strength can be provided.

The concentration of the alkali ions in the glass substrate 2 can be prevented from concentrating to the interface between the buffer film 3 and the glass substrate 2. In addition, alkali can be prevented from being deposited on the surface of the bonding film 4. For these reasons, another material can be bonded to the bonding film 4.

Figure 6:
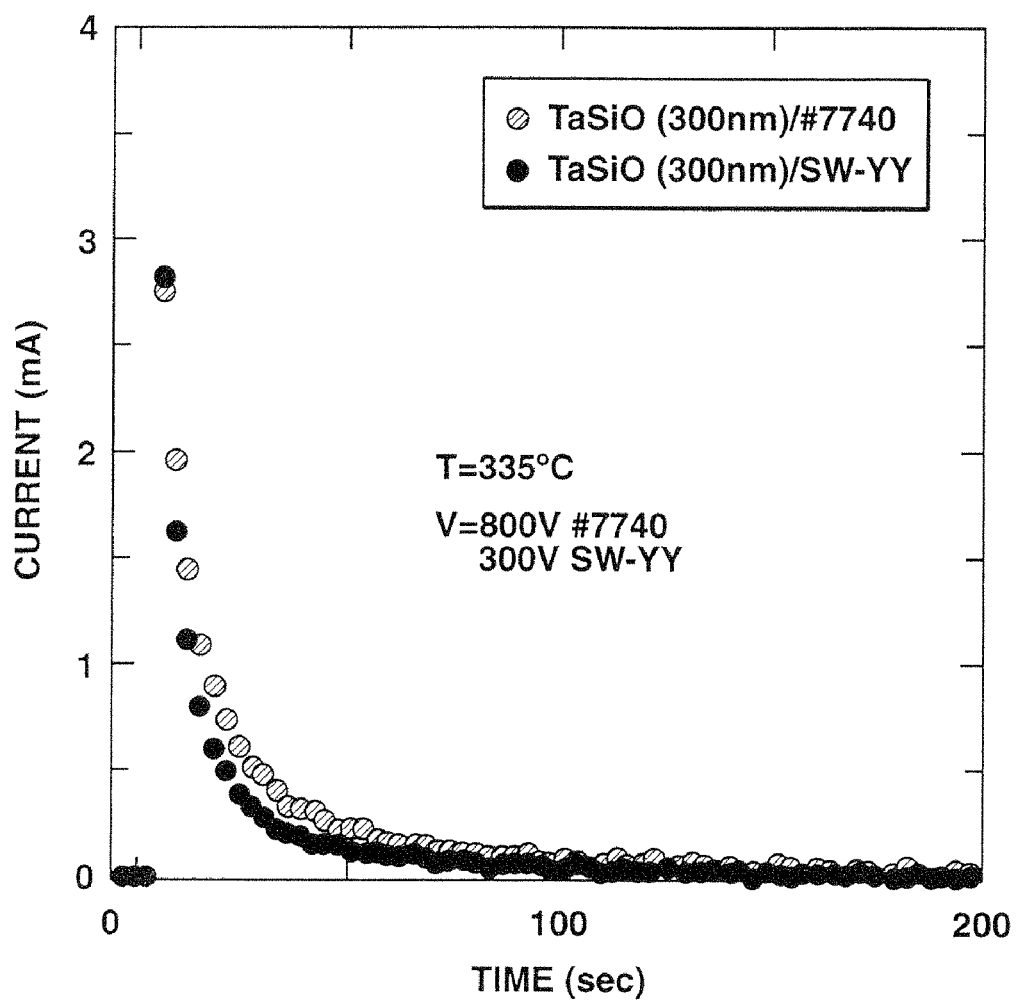
FIG. 6 is a graph showing the relationship between time from the start of anodic bonding and the current which flows between the electrodes.

When a glass substrate containing lithium (e.g., SW-YY) is used as the glass substrate 2, the application voltage in anodic bonding can be made low. FIG. 6 is a graph showing the relationship between time from the start of anodic bonding and the current which flows between the electrodes in anodic bonding using a glass substrate containing lithium (SW-YY) and anodic bonding using a glass substrate without lithium (PYREX (registered trademark) of product number #7740 available from CORNING). The buffer film 3 was made of a Ta—Si—O based material having a thickness of 300 nm. The voltage applied between the electrodes was 300V for the glass substrate containing lithium. The voltage applied between the electrodes was 80V for the glass substrate without lithium. As is apparent from FIG. 6, even when the glass substrate containing lithium is anodic-bonded at 300V, the current and time change exhibit almost the same behavior as in anodic-bonding the glass substrate without lithium at 800V. For this reason, when the glass substrate containing lithium (e.g., SW-YY available from ASAHI TECHNOGLASS CORPORATION) is used as the glass substrate 2, the application voltage in anodic bonding can be made low. Lithium ions have a radius of about 0.59 Å, which is much smaller than sodium ions, and therefore easily move in the glass substrate 2 in anodic bonding.

As shown in FIG. 3, the plurality of glass substrates 2 each of which has the bonding film 4 and is not anodic-bonded yet are stacked. The bonding film 4 of the uppermost glass substrate 2 is connected to the positive electrode or pole of the anodic bonding apparatus 10. The negative electrode or pole of the anodic bonding apparatus 10 is connected to the lowermost glass substrate 2 or the bonding film 4 of the lowermost glass substrate 2. In this state, the plurality of glass substrates 2 and the plurality of bonding films 4 in contact with them may be anodic-bonded at once. The lowermost glass substrate 2 need not always have the buffer film 3 and bonding film 4 if the glass substrate 2 is not bonded to another glass substrate or conductive film after anodic bonding.

When a plurality of anodic bonding processes are executed in the same electric field direction by the above manufacturing method, bonding is possible even when the bonding film 4 is directly provided on the surface 2a of the glass substrate 2 without the buffer film 3.

In the above manufacturing method, the new glass substrates 2 are sequentially stacked on the side of the stage 8 and anodic-bonded. However, the present invention is not limited to this. The silicon substrate 5 and glass substrate 2 shown in FIGS. 1A to 1D, the glass substrates 2 and 6 shown in FIG. 2, or the glass substrates 2, 2', and 2" shown in FIG. 4, whose relative positions in the vertical direction and upper and lower surfaces are inverted, may be anodic-bonded. More specifically, the stage 8 on which the silicon substrate 5, glass substrate 6, or glass substrate 2' is placed is arranged on the lower side. The glass substrate 2 is placed while making the other surface 2b with the trench 2c contact the upper surface of the silicon substrate 5, the bonding film 7 provided on the upper surface of the glass substrate 6, or the bonding film 4 provided on the upper surface side of the glass substrate 2'. The weight plate 9 is placed on the bonding film 4 provided on the side of the surface 2a of the glass substrate 2. The silicon substrate 5, the bonding film 7 provided on the glass substrate 6, or the bonding film 4 provided on the side of the surface 2a of the glass substrate 2' is connected to the positive electrode of the anodic bonding apparatus 10. The bonding film 4 provided on the side of the surface 2a of the glass substrate 2 is connected to the negative electrode. In this state, anodic bonding is done. Subsequently, the new glass substrate 2 having the buffer film 3 and bonding film 4 is sequentially stacked while making the surface 2a directed upward. The weight plate 9 is placed on the new glass substrate 2. The bonding film 4 of the uppermost glass substrates 2 is connected to the negative electrode. In this state, anodic bonding is executed. When the plate weight 9 made of a conductive material is used, the negative electrode of the anodic bonding apparatus 10 can be electrically connected to the uppermost bonding film 4 through the weight plate 9.

The stack structure (stack microreactor 1) is used for a reformer which obtains hydrogen to be supplied to a fuel cell by reforming hydrocarbon fuel such as methanol. Especially, the stack structure can be used for a vaporizer which vaporizes hydrocarbon fuel, a hydrogen reformer which reforms vaporized hydrocarbon fuel into hydrogen, or a carbon monoxide remover which removes, by chemical reaction, carbon monoxide as a by-product generated by the hydrogen reformer.

In the above embodiment, the buffer film 3 is provided on the side of the surface opposing the bonding surface of the glass substrate 2. However, the present invention is not limited to this. Anodic bonding may be executed by providing the buffer film 3 on the stage 8 which comes into contact with the entire opposing surface. In consideration of misalignment which occurs when the glass substrate 2 is placed on the stage 8, the buffer film 3 preferably has an area larger than the glass substrate 2 so that the entire surface of the glass substrate 2 can be covered.

In the above embodiment, the bonding film 4 is provided on the glass substrate 2. However, the buffer film 3 may be provided directly on the glass substrate 2 without providing the bonding film 4. Alternatively, the glass substrate 2 without the bonding film 4 may be placed on the buffer film 3 on the stage 8 and anodic-bonded.

Second Embodiment

A method of manufacturing a second stack microreactor to which the present invention is applied will be described with reference to sectional views shown in FIGS. 7A to 11.

Figure 7A:
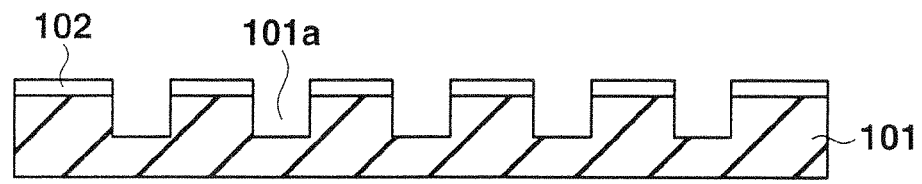
FIGS. 7A and 7B are sectional and plan views, respectively, for illustrating a step in manufacturing a microreactor having a stack structure.
Figure 7B:
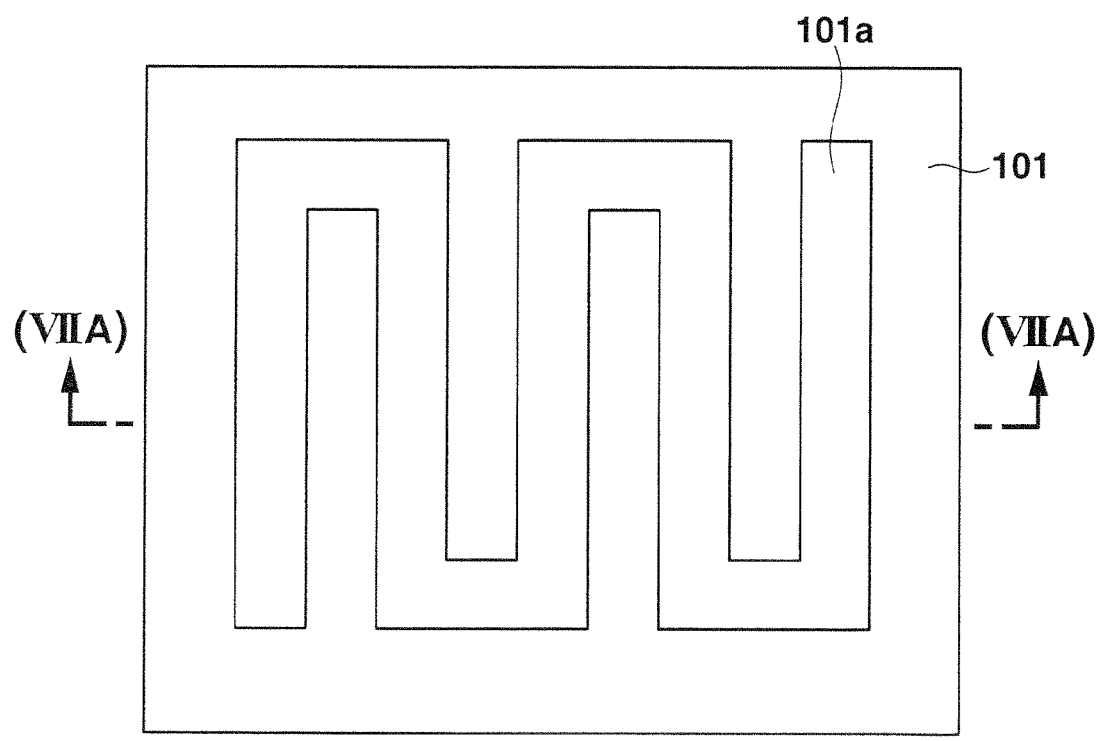

FIG. 7B is a plan view of the first glass substrate 101. FIG. 7A is a sectional view taken along a line VIIA-VIIA in FIG. 7B.

As shown in FIGS. 7A and 7B, a first glass substrate 101 is prepared. A zigzag trench 101a is formed in one surface of the first glass substrate 101. A bonding film 102 is formed on a portion of said one surface of the first glass substrate 101 except the trench 101a. The component composition of the first glass substrate 101 is the same as that of the glass substrate 2 of the first embodiment. All glass substrates used in the second embodiment have the same component composition as that of the glass substrate 2 of the first embodiment.

To form the trench 101a, one surface of the first glass substrate 101 may be subjected to known sandblasting. Alternatively, known photolithography and etching may be executed.

To pattern the bonding film 102, lift-off can be used. More specifically, while keeping the trench 101a covered with a resist, the bonding film is entirely formed on said one surface of the first glass substrate 101 by vapor deposition. The part of the bonding film overlapping the trench 101a is removed together with the resist, thereby leaving the bonding film 102 on the portion except the trench 101a. The component of the bonding film 102 is the same as that of the bonding film 4 (FIGS. 1A to 1D) of the first embodiment. All bonding films used in the second embodiment have the same component as that of the bonding film 4 of the first embodiment.

Figure 8:
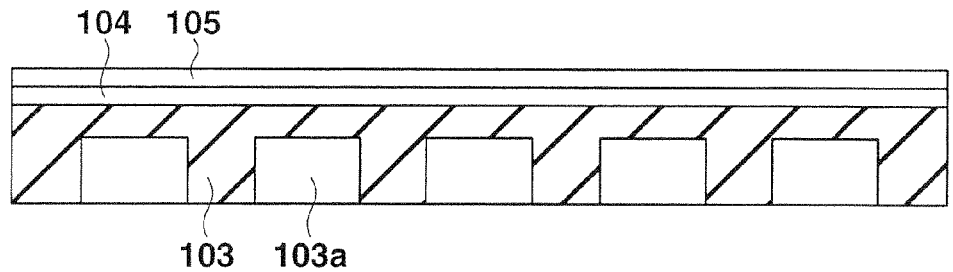
FIG. 8 is a sectional view for illustrating a step next to FIGS. 7A and 7B.

As shown in FIG. 8, a second glass substrate 103 having a zigzag trench 103a formed in one surface is prepared. A buffer film 104 is formed on the other surface of the second glass substrate 103. A bonding film 105 is formed on the buffer film 104. The component and forming method of the buffer film 104 are the same as those of the buffer film 3 of the first embodiment. All buffer films used in the second embodiment have the same component composition as that of the buffer film 3 of the first embodiment. The trench 103a is plane-symmetrical to the trench 101a of the first glass substrate 101.

Figure 9:
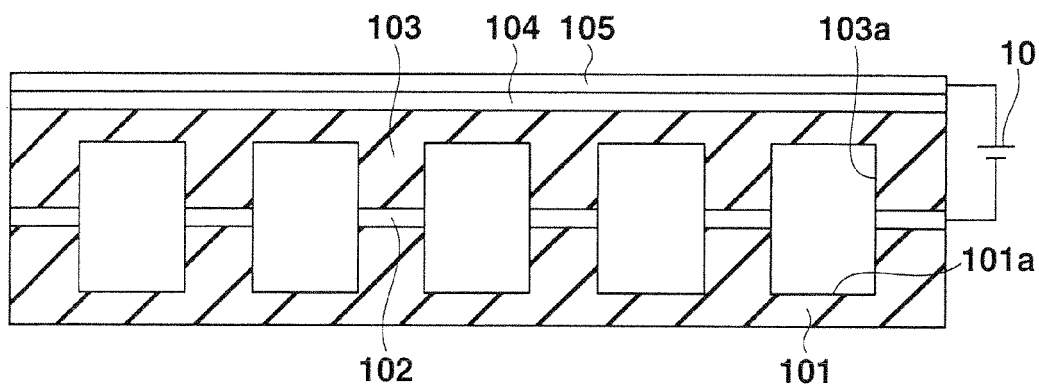
FIG. 9 is a sectional view for illustrating a step next to FIG. 8.

As shown in FIG. 9, while making the trench 101a oppose the trench 103a, said one surface of the second glass substrate 103 is pressed against the bonding film 102. A voltage is applied between the bonding films 102 and 105 by the electric source 10 such that the potential of the bonding film 105 becomes higher than that of the bonding film 102. In addition, the structure is heated to 300° C. to 400° C. With this process, anodic bonding is done. Since the buffer film 104 is formed on the second glass substrate 103, the alkali ion concentration can be suppressed from concentrating to the other surface of the second glass substrate 103.

Figure 10:
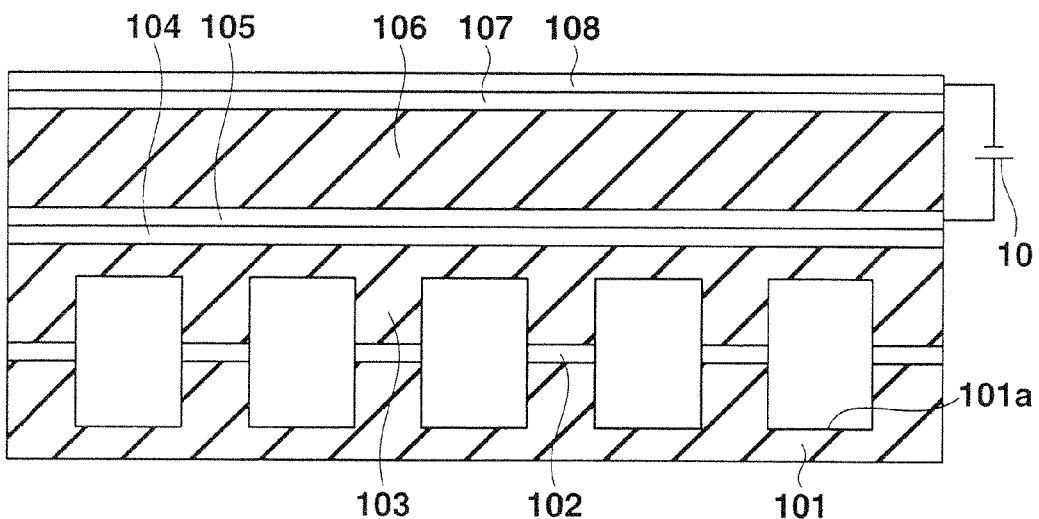
FIG. 10 is a sectional view for illustrating a step next to FIG. 9.

As shown in FIG. 10, a third glass substrate 106 for heat buffering, which has a buffer film 107 and bonding film 108 sequentially formed on one surface, is prepared. The other surface of the third glass substrate 106 is pressed against the bonding film 105. A voltage is applied between the bonding films 105 and 108 by the voltage source 10 such that the potential of the bonding film 108 becomes higher than that of the bonding film 105. In addition, the structure is heated to 300° C. to 400° C. With this process, anodic bonding is done. A thin film heater 151 (FIG. 11) made of an electrothermal material is patterned on part of the bonding film 108. The resultant structure is used as a combustion fuel vaporizer 171 which vaporizes, by heat from the thin film heater 151, combustion fuel flowing through the flow path formed by the trenches 101a and 103a of the glass substrates 101 and 103. The vaporized combustion fuel is supplied to a flow path formed by a trench 115a formed in a glass substrate 115 (to be described later), a flow path formed by a trench 124a formed in a glass substrate 124, and a flow path formed by trenches 133a and 136a formed in glass substrates 133 and 136.

Glass substrates 109, 112, 115, 118, 121, 124, 127, 130, 133, and 136 are bonded in this order by sequentially repeating the following steps (a) and (b) below like when the first glass substrate 101 is bonded to the second glass substrate 103 or when the third glass substrate 106 is bonded to the second glass substrate 103.

(a) A buffer film and bonding film are sequentially formed on one surface of a new glass substrate.

(b) The other surface of the new glass substrate is pressed against the bonding film formed on the precedingly anodic-bonded glass substrate. A voltage is applied between the preceding bonding film and the new bonding film such that the potential of the bonding film of the preceding glass substrate becomes higher than that of the bonding film of the new glass substrate. In addition, the structure is heated to 300° C. to 400° C. That is, anodic bonding is done.

Figure 11:
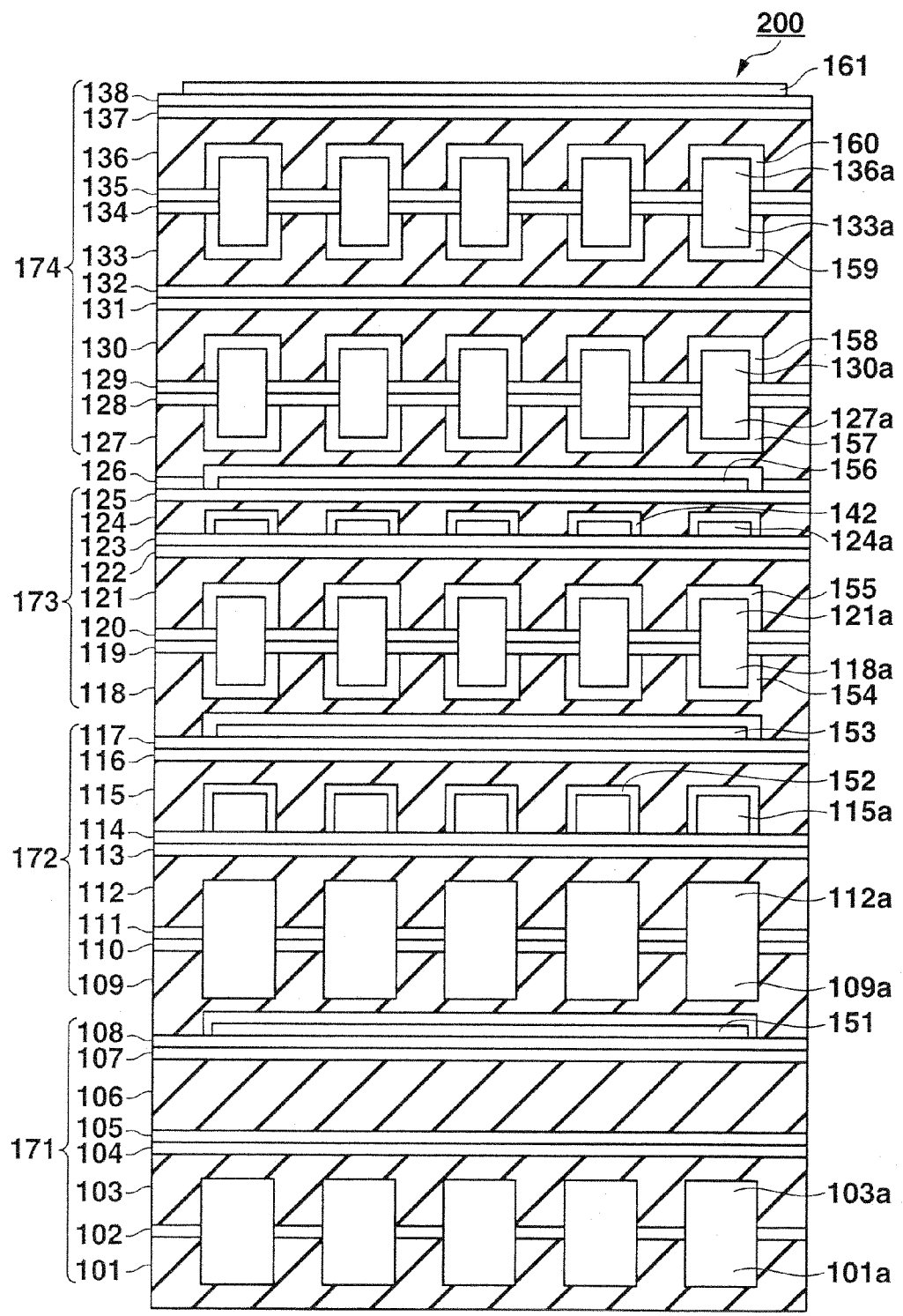
FIG. 11 is a sectional view of a completed microreactor 200.
Figure 12A:
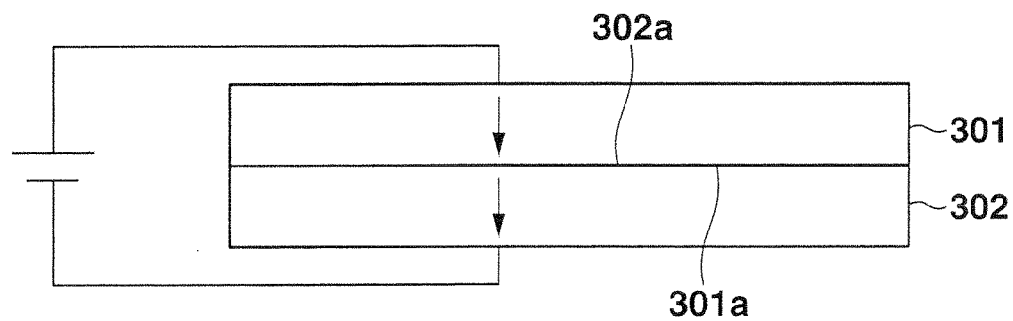
FIGS. 12A and 12B are sectional views for illustrating an anodic bonding step.
Figure 12B:
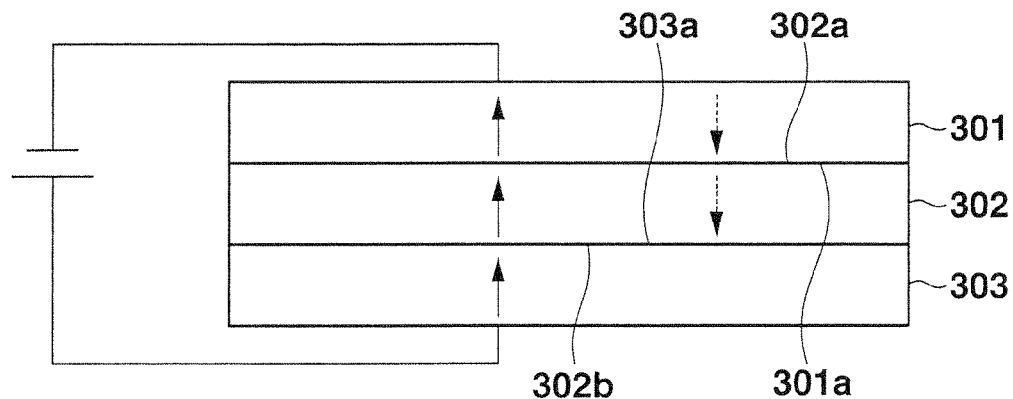

When the glass substrates 109, 112, 115, 118, 121, 124, 127, 130, 133, and 136 are sequentially bonded in the above-described way, a stack microreactor 200 shown in FIG. 11 serving as a chemical reaction furnace is completed. Referring to FIG. 11, each of the glass substrates 103, 106, 109, 112, 115, 118, 121, 124, 127, 130, 133, and 136 is anodic-bonded to the upper bonding film by applying a voltage such that the lower bonding film has a potential higher than that of the upper bonding film. Hence, in each of the glass substrates 103, 106, 109, 112, 115, 118, 121, 124, 127, 130, 133, and 136, an electric field directed upward is applied in anodic bonding. In the example shown in FIG. 11, the positions of the end faces of the glass substrates match. To easily connect the structure to the anodic bonding apparatus, the positions of the end faces of the glass substrates are preferably shifted, as shown in FIG. 4C.

The stack microreactor 200 will be described.

The fourth glass substrate 109 is anodic-bonded to the bonding film 108 while forming a space around the thin film heater 151. A zigzag trench 109a is formed in the surface of the fourth glass substrate 109 opposite to the bonding surface to the bonding film 108. A buffer film 110 and bonding film 111 are sequentially formed on a portion of the surface except the trench 109a.

The fifth glass substrate 112 is anodic-bonded to the bonding film 111. A trench 112a plane-symmetrical to the trench 109a is formed in the bonding surface of the fifth glass substrate 112 to the bonding film 111. A buffer film 113 and bonding film 114 are sequentially formed on the surface opposite to the bonding surface.

The sixth glass substrate 115 is anodic-bonded to the bonding film 114. A zigzag trench 115a is formed in the bonding surface of the sixth glass substrate 115 to the bonding film 114. A combustion catalyst 152 is formed on the wall surface of the trench 115a. A buffer film 116 and bonding film 117 are sequentially formed on the surface of the sixth glass substrate 115 opposite to the bonding surface to the bonding film 114. A thin film heater 153 is formed on part of the bonding film 117. A reformed fuel vaporizer 172 includes a microreactor including the glass substrates 109 and 112, buffer film 110, and bonding film 111, a reformed fuel vaporization combustor which includes the sixth glass substrate 115 and combustion catalyst 152 to heat the microreactor, and the thin film heater 153. The reformed fuel vaporizer 172 supplies vaporized reformed fuel to a hydrogen reformer 174 (to be described later).

The seventh glass substrate 118 is anodic-bonded to the bonding film 117 while forming a space around the thin film heater 153. A zigzag trench 118a is formed in the surface of the seventh glass substrate 118 opposite to the bonding surface to the bonding film 117. A carbon monoxide oxidation catalyst 154 is formed on the wall surface of the trench 118a. A buffer film 119 and bonding film 120 are sequentially formed on a portion of the opposite surface except the trench 118a.

The eighth glass substrate 121 is anodic-bonded to the bonding film 120. A zigzag trench 121a plane-symmetrical to the trench 118a is formed in the bonding surface of the eighth glass substrate 121 to the bonding film 120. A carbon monoxide oxidation catalyst 155 is formed on the wall surface of the trench 121a. A buffer film 122 and bonding film 123 are sequentially formed on the surface of the eighth glass substrate 121 opposite to the bonding surface to the bonding film 120.

The ninth glass substrate 124 is anodic-bonded to the bonding film 123. A zigzag trench 124a is formed in the bonding surface of the ninth glass substrate 124 to the bonding film 123. A combustion catalyst 142 is formed on the wall surface of the trench 124a. A buffer film 125 is formed on the surface of the ninth glass substrate 124 opposite to the bonding surface to the bonding film 123. A bonding film 126 is formed around the buffer film 125. A thin film heater 156 is formed at the central portion of the buffer film 125.

A carbon monoxide remover 173 has a microreactor including the glass substrates 118 and 121, buffer film 119, and bonding film 120, a carbon monoxide removing combustor which includes the glass substrate 124 and combustion catalyst 142 to heat the microreactor, and the thin film heater 156. The carbon monoxide remover 173 oxidizes carbon monoxide generated by the hydrogen reformer 174 (to be described later) into carbon dioxide.

The 10th glass substrate 127 is anodic-bonded to the bonding film 126 while forming a space around the thin film heater 156. A zigzag trench 127a is formed in the surface of the 10th glass substrate 127 opposite to the bonding surface to the bonding film 126. A fuel reforming catalyst 157 is formed on the wall surface of the trench 127a. A buffer film 128 and bonding film 129 are sequentially formed on a portion of the opposite surface except the trench 127a.

The 11th glass substrate 130 is anodic-bonded to the bonding film 129. A zigzag trench 130a plane-symmetrical to the trench 127a is formed in the bonding surface of the 11th glass substrate 130 to the bonding film 129. A fuel reforming catalyst 158 is formed on the wall surface of the trench 130a. A buffer film 131 and bonding film 132 are sequentially formed on the surface of the 11th glass substrate 130 opposite to the bonding surface to the bonding film 129.

The 12th glass substrate 133 is anodic-bonded to the bonding film 132. A zigzag trench 133a is formed in the surface opposite to the bonding surface. A combustion catalyst 159 is formed on the wall surface of the trench 133a. A buffer film 134 and bonding film 135 are sequentially formed on a portion of the opposite surface except the trench 133a.

The 13th glass substrate 136 is anodic-bonded to the bonding film 135. A zigzag trench 136a plane-symmetrical to the trench 133a is formed in the bonding surface of the 13th glass substrate 136 to the bonding film 135. A combustion catalyst 160 is formed on the wall surface of the trench 136a. A buffer film and bonding film 138 are sequentially formed on the surface of the 13th glass substrate 136 to the bonding surface to the bonding film 135. A thin film heater 161 is formed on part of the bonding film 138.

The hydrogen reformer 174 has a microreactor including the glass substrates 127 and 130, buffer film 128, and bonding film 129, a hydrogen reforming combustor which includes the glass substrates 133 and 136, buffer film 134, bonding film 135, and combustion catalysts 159 and 160 to heat the microreactor, and the thin film heater 161. The hydrogen reformer 174 reforms the reformed fuel vaporized by the reformed fuel vaporizer 172 into hydrogen. The hydrogen reformer 174 supplies, to the carbon monoxide remover 173, a mixed fluid containing hydrogen and carbon monoxide generated as a by-product.

In the combustion fuel vaporizer 171 of the microreactor 200, combustion fuel such as methanol is heated and vaporized by heat from the thin film heater 151 or a combustor (to be described later) when the combustion fuel flows through the trenches 101a and 103a. The combustion fuel vaporized by the vaporizer is mixed with air and supplied to the combustors of the hydrogen reformer 174, carbon monoxide remover 173, and reformed fuel vaporizer 172. That is, the combustion fuel flows to the flow path formed by the trenches 133a and 136a, the flow path formed by the trench 124a, and the flow path formed by the trench 115a.

The vaporized combustion fuel is oxidized by the catalysis of the combustion catalyst 152 and burns while flowing through the flow path of the trench 115a. Similarly, the vaporized combustion fuel is oxidized by the catalysis of the combustion catalyst 142 and burns while flowing through the flow path of the trench 124a. The vaporized fuel is oxidized by the catalysis of the combustion catalysts 159 and 160 and burns while flowing through the flow path of the trenches 133a and 136a. Heat of combustion is generated to heat the reformed fuel vaporizer 172, carbon monoxide remover 173, and hydrogen reformer 174 to promote reactions in the reformed fuel vaporizer 172, carbon monoxide remover 173, and hydrogen reformer 174. Main heat sources in the reformed fuel vaporizer 172, carbon monoxide remover 173, and hydrogen reformer 174 are preferably these combustors. The thin film heaters 153, 156, and 161 are preferably used as auxiliary heat sources to adjust the temperatures required in the reformed fuel vaporizer 172, carbon monoxide remover 173, and hydrogen reformer 174.

A vaporizer is constituted by the fourth glass substrate 109 and fifth glass substrate 112. More specifically, a mixture of water and combustion fuel such as methanol is heated mainly by the heat of combustion by the sixth glass substrate 115 and the thin film heater 153 and evaporates while flowing through the flow path formed by the trenches 109a and 112a. The mixture of the vaporized combustion fuel and water flows to the flow path formed by the trenches 127a and 130a.

The mixture of the combustion fuel and water is heated mainly by the heat of combustion by the combustor formed by the glass substrates 133 and 136 and the heat from the thin film heater 161 and reformed into hydrogen by the catalysis of the fuel reforming catalysts 157 and 158 while flowing through the trenches 127a and 130a. That is, a vapor reformer is constituted by the glass substrates 127 and 130 and the fuel reforming catalysts 157 and 158. In this vapor reformer, carbon dioxide and carbon monoxide are also generated as by-products. The products such as hydrogen are mixed with air and supplied to the flow path formed by the trenches 118a and 121a.

While the products such as hydrogen flow through the flow path formed by the trenches 118a and 121a, carbon monoxide in the products is oxidized by the catalysis of the carbon monoxide oxidation catalysts 154 and 155. With this process, carbon monoxide is removed.

The products such as hydrogen are supplied from the carbon monoxide remover to the fuel electrode of a fuel cell. Oxygen in air is supplied to the air electrode. An electric energy is generated by the electrochemical reaction in the fuel cell.

Even in the microreactor 200, concentration of alkali ion concentration in each glass substrate or deposition of alkali can be prevented. For this reason, the bonding strength of the anodic bonding surfaces is high. Hence, the microreactor 200 having a high bonding strength can be provided.

As described above, in the embodiments, the electric field which acts in a glass substrate in anodic-bonding a silicon substrate to one surface of the glass substrate in the post-process has the same direction as the electric field which acts in the glass substrate in anodic-bonding another silicon substrate to the other surface of the glass substrate in the preprocess. Hence, the bonding between the silicon substrate and the other surface of the glass substrate, which are precedingly anodic-bonded, can be prevented from being adversely affected. In addition, when positive charges such as sodium ions serving as carriers are generated in the glass substrate in anodic bonding of the preprocess, the ions can be prevented from being deposited as a compound near one surface of the glass substrate due to the electric field generated in the pre-process. Hence, bonding between the silicon substrate and the surface of the glass substrate in the post-process is not inhibited.

Since no electric fields in the reverse directions act in the glass substrates 103, 106, 109, 112, 115, 118, 121, 124, 127, 130, 133, and 136, no discoloring occurs in the glass substrates 103, 106, 109, 112, 115, 118, 121, 124, 127, 130, 133, and 136. For this reason, the microreactor 200 having a stack structure can easily be manufactured.

When glass substrates containing lithium are used as the glass substrates 103, 106, 109, 112, 115, 118, 121, 124, 127, 130, 133, and 136, the voltage in anodic bonding can be made low.

What is claimed is:

1. A method of manufacturing a stack structure provided with a plurality of substrates including at least a first substrate, a second substrate including glass, and a third substrate, the method comprising:

applying a first electric field acting in a direction between the first and second substrates to bond a first bonding film located between one surface of the first substrate and one surface of the second substrate to oxygen atoms in the glass in the second substrate, and to effect anodic bonding of the first and second substrates to each other in such a manner as to incorporate alkali components in the glass in the second substrate into a first buffer film provided on the other surface of the second substrate; and applying a second electric field acting in the same direction as the first electric field, between the second substrate and the third substrate, the third substrate including glass, to bond a second bonding film which is located between the other surface of the second substrate and one surface of the third substrate, to oxygen atoms in the glass of the third substrate, and to effect anodic bonding of the second and third substrates in such a manner as to incorporate alkali components in the glass of the third substrate into a second buffer film provided on the other surface of the third substrate.

2. The method according to claim 1, wherein the anodic bonding between the first substrate and the second substrate and the anodic bonding between the second substrate and the third substrate are performed at different times.

3. The method according to claim 1, wherein the anodic bonding between the first substrate and the second substrate and the anodic bonding between the second substrate and the third substrate are performed at the same time.

4. The method according to claim 1, wherein at least one of the first and second bonding films comprises a material having at least one of a metal and an alloy each having a melting point of 2,000° C. or higher, when said at least one of the first and second bonding films is not bonded to oxygen atoms by anodic bonding.

5. The method according to claim 1, wherein at least one of the first and second bonding films has a material comprising at least one of Ta, W, Mo, $TaSi_2$, $WSi_2$, and $MoSi_2$, when said at least one of the first and second bonding films is not bonded to oxygen atoms by anodic bonding.

6. The method according to claim 1, wherein at least one of the first and second buffer films has a material having a resistivity lower than a resistivity of at least one of the first and second substrates.

7. The method according to claim 1, wherein at least one of the first and second buffer films comprises an amorphous oxide.

8. The method according to claim 1, wherein at least one of the first and second buffer films is formed of at least one of (i) a compound comprising Ta, Si, and O, (ii) a compound comprising La, Sr, Mn, and O, and (iii) lead glass.

9. The method according to claim 1, wherein the alkali components in at least one of the glass in the second substrate and the glass in the third substrate comprises at least one of Na and Li.

10. A method of manufacturing a stack structure provided with a plurality of substrates, comprising:

manufacturing a plurality of stack structures according to the method recited in claim 1, and applying an electric field acting in the same direction as the first and second electric fields between the stack structures, through a bonding film located therebetween to effect anodic bonding between the stack structures.

11. A method of manufacturing a stack structure provided with a plurality of substrates, the method comprising:

bonding a first substrate, which is included in the plurality of substrates and which comprises one of silicon and glass, to oxygen atoms in glass in a second substrate included in the plurality of substrates, and effecting anodic bonding between the first and second substrates in such a manner as to incorporate alkali components in the glass in the second substrate into a first buffer film provided on a surface of the second substrate to which the first substrate is not bonded, the bonding being performed by applying a first electric field acting in a direction between the first and second substrates; and bonding a bonding film provided between the second substrate and a third substrate, which is included in the plurality of substrates and which comprises glass, to oxygen atoms in the glass in the third substrate, by applying a second electric field acting in the same direction as the first electric field, between the second and third substrates, and effecting anodic bonding between the second and third substrates in such a manner as to incorporate alkali components in the glass in the third substrate into a second buffer film provided on a surface of the third substrate to which the second substrate is not bonded.

\* \* \* \* \*